(12) United States Patent
Yang et al.

(10) Patent No.: US 10,483,296 B2
(45) Date of Patent: Nov. 19, 2019

(54) TFT AND MANUFACTURING METHOD THEREOF, ARRAY SUBSTRATE AND MANUFACTURING METHOD THEREOF, AND DISPLAY DEVICE

(71) Applicant: BOE Technology Group Co., Ltd., Beijing (CN)

(72) Inventors: Wei Yang, Beijing (CN); Xiang Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 46 days.

(21) Appl. No.: 15/300,362

(22) PCT Filed: Oct. 19, 2015

(86) PCT No.: PCT/CN2015/092206
§ 371 (c)(1),
(2) Date: Sep. 29, 2016

(87) PCT Pub. No.: WO2016/197502
PCT Pub. Date: Dec. 15, 2016

(65) Prior Publication Data
US 2017/0186784 A1     Jun. 29, 2017

(30) Foreign Application Priority Data

Jun. 8, 2015   (CN) .......................... 2015 1 0308890

(51) Int. Cl.
*H01L 27/12*       (2006.01)
*H01L 21/425*      (2006.01)
(Continued)

(52) U.S. Cl.
CPC ........ *H01L 27/1288* (2013.01); *H01L 21/425* (2013.01); *H01L 27/124* (2013.01);
(Continued)

(58) Field of Classification Search
CPC .............. H01L 27/1225; H01L 27/124; H01L 29/78696; H01L 27/1288; H01L 29/7869; H01L 27/127
See application file for complete search history.

(56) References Cited

U.S. PATENT DOCUMENTS

2006/0290866 A1   12/2006   Choi et al.
2008/0002081 A1   1/2008    Kim et al.
(Continued)

FOREIGN PATENT DOCUMENTS

CN         103715094 A      4/2014
CN         104022076 A      9/2014
(Continued)

OTHER PUBLICATIONS

Feb. 29, 2016—(WO) International Search Report and Written Opinion Appn PCT/CN2015/092206 with English Tran.
(Continued)

*Primary Examiner* — Changhyun Yi
(74) *Attorney, Agent, or Firm* — Banner & Witcoff, Ltd.

(57) ABSTRACT

A thin-film transistor (TFT) and a manufacturing method thereof, an array substrate and a manufacturing method thereof, and a display device are disclosed. The manufacturing method of a TFT includes: forming an active layer, a gate electrode, a source electrode and a drain electrode respectively electrically connected with the active layer, and a gate insulating layer disposed between the gate electrode and the active layer, so that the gate electrode, the source electrode and the drain electrode are formed in the same patterning process. The method can reduce the number of masks used in the manufacturing process of the TFT or an array substrate, reduce the technology process, improve the productivity, and reduce the production cost.

18 Claims, 5 Drawing Sheets

(51) Int. Cl.
*H01L 29/423* (2006.01)
*H01L 29/66* (2006.01)
*H01L 29/786* (2006.01)
*G02F 1/1362* (2006.01)
*G02F 1/1368* (2006.01)
*H01L 27/32* (2006.01)

(52) U.S. Cl.
CPC ........ *H01L 27/127* (2013.01); *H01L 27/1225* (2013.01); *H01L 29/42364* (2013.01); *H01L 29/66742* (2013.01); *H01L 29/66757* (2013.01); *H01L 29/66765* (2013.01); *H01L 29/66969* (2013.01); *H01L 29/7866* (2013.01); *H01L 29/7869* (2013.01); *H01L 29/78696* (2013.01); *G02F 1/1368* (2013.01); *G02F 1/136286* (2013.01); *G02F 2201/121* (2013.01); *G02F 2201/123* (2013.01); *H01L 27/3262* (2013.01); *H01L 27/3276* (2013.01); *H01L 2227/323* (2013.01)

(56) References Cited

U.S. PATENT DOCUMENTS

2014/0061632 A1* 3/2014 Lee .................. H01L 29/78633
                                                          257/43
2014/0145177 A1* 5/2014 Lee ..................... H01L 29/7869
                                                          257/43
2014/0332760 A1* 11/2014 Nishimura .......... H01L 51/0018
                                                          257/40
2016/0181289 A1   6/2016 Long et al.
2016/0293771 A1  10/2016 Long et al.
2017/0040343 A1   2/2017 Hsin

FOREIGN PATENT DOCUMENTS

| CN | 104022077 A | 9/2014 |
| CN | 104253159 A | 12/2014 |
| CN | 104637955 A | 5/2015 |
| CN | 104681627 A | 6/2015 |
| CN | 104681630 A | 6/2015 |
| CN | 104851789 A | 8/2015 |

OTHER PUBLICATIONS

Mar. 27, 2017—(CN) First Office Action Appn 201510308890.7 with English Tran.
Nov. 23, 2017—(CN) Second Office Action Appn 201510308890.7 with English Tran.
Feb. 4, 2019—(EP) Extended European Search Report Appn. 15885770.6.

* cited by examiner

TFT AND MANUFACTURING METHOD THEREOF, ARRAY SUBSTRATE AND MANUFACTURING METHOD THEREOF, AND DISPLAY DEVICE This application is a U.S. National Phase Entry of International Application No. PCT/CN2015/092206 filed on Oct. 19, 2015, designating the United States of America and claiming priority to Chinese Patent Application No. 201510308890.7, filed on Jun. 8, 2015.The present application claims priority to and the benefit of the above-identified applications and the above-identified applications are incorporated by reference herein in the entirety.

TECHNICAL FIELD

At least one embodiment of the present invention relates to a thin-film transistor (TFT) and a manufacturing method thereof, an array substrate and a manufacturing method thereof, and a display device.

BACKGROUND

In the technical field of display, liquid crystal display (LCD) devices and organic light-emitting diode (OLED) display devices are two kinds of mainstream display products.

The LCD device controls the deflection of liquid crystal molecules by utilization of electric fields formed between pixel electrodes and common electrodes, and hence controls light running through the LCD panel thereof. The pixel electrodes and the common electrodes may be both disposed on an array substrate of a display device, or the pixel electrodes are disposed on the array substrate and the common electrodes are disposed on an opposing substrate arranged opposite to the array substrate.

The OLED display device displays by utilization of the light emitting of a light emitting layer (EML) between an anode and a cathode. The anode, the cathode and the EML are disposed on an array substrate in the display device.

No matter in an LCD device or in an OLED display device, a plurality of TFTs is arranged on the array substrate, and the TFTs may include amorphous silicon TFTs, polysilicon TFTs, oxide TFTs, etc.

SUMMARY

Embodiments of the present invention provide a TFT and a manufacturing method thereof, an array substrate and a manufacturing method thereof, and a display device, which reduce the number of masks used in the manufacturing process of the TFT or the array substrate, reduce the technological process, improve the productivity, and reduce the production cost.

At least embodiment of the present invention provides an array substrate, comprising a thin-film transistor (TFT) disposed on a base substrate; the TFT includes an active layer, a gate electrode, a source electrode and a drain electrode respectively electrically connected with the active layer, and a gate insulating layer disposed between the gate electrode and the active layer; and the gate electrode, the source electrode and the drain electrode are formed in a same patterning process.

At least embodiment of the present invention further provides a display device, comprising the above mentioned array substrate.

At least embodiment of the present invention further provides a thin film transistor (TFT), comprising an active layer, a gate electrode, a source electrode and a drain electrode respectively electrically connected with the active layer, and a gate insulating layer disposed between the gate electrode and the active layer; the gate electrode, the source electrode and the drain electrode are formed in a same patterning process.

At least embodiment of the present invention further provides a method for manufacturing a thin film transistor (TFT), comprising: forming an active layer, a gate electrode, a source electrode and a drain electrode respectively electrically connected with the active layer, and a gate insulating layer disposed between the gate electrode and the active layer; the gate electrode, the source electrode and the drain electrode are formed in a same patterning process.

At least embodiment of the present invention further provides a method for manufacturing an array substrate, comprising: forming a thin film transistor (TFT) on a base substrate, wherein the TFT is manufactured by the above mentioned method for manufacturing a thin film transistor.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
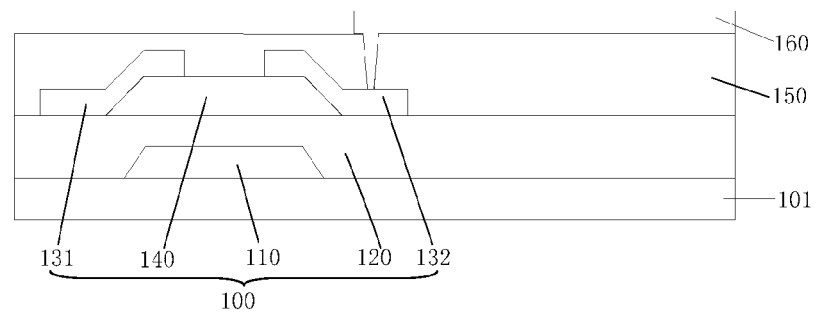
FIG. 1a is a schematic structural sectional view of an array substrate provided with a bottom-gate TFT.

FIG. 1*a* is a schematic structural sectional view of a pixel unit in an array substrate. As illustrated in FIG. 1*a*, a thin film transistor (TFT) 100, a first passivation layer 150 and a pixel electrode 160 are sequentially disposed on a base substrate 101. The first passivation layer 150 covers the TFT 100. The TFT 100 adopts a bottom-gate structure and includes a gate electrode 110, a gate insulating layer 120, an active layer 140 and a source electrode 131 and a drain electrode 132 which are respectively lapped and connected to the active layer 140. The TFT 100 may be an oxide TFT, and the active layer 110 of the TFT 100 may be made from a metal oxide material, e.g., indium gallium zinc oxide (IGZO). At this point, the manufacturing method of the array substrate, for instance, comprises the following steps 1 to 6.

Step 1: forming gate electrodes 110 and a plurality of gate lines (not shown in FIG. 1*a*) on a base substrate 101 by a first patterning process (also referred to as mask process, for instance, including steps such as exposing, developing and etching).

Step 2: forming a gate insulating layer 120 and lead via holes (not shown in FIG. 1*a*) disposed in the gate insulating layer 120 by a second patterning process. A lead via hole is configured to achieve the connection between an electrode drive line and a driver integrated circuit (IC). For instance, a gate line (namely a drive line of the gate electrode 110) is led to a driver IC in a pad area through corresponding lead via hole.

Step 3: forming active layers 140 on the gate insulating layer 120 by a third patterning process.

Step 4: forming source electrodes 131 and drain electrodes 132 respectively lapped and connected to the active layers 140, and a plurality of data lines (not shown in FIG. 1*a*) by a fourth patterning process.

Step 5: forming a first passivation layer 150 by a fifth patterning process, and forming via holes, through which the drain electrodes 132 are exposed, and lead via holes (not shown in FIG. 1*a*) in the first passivation layer 150. A lead via hole is configured to achieve the connection between an electrode drive line and a driver IC. For instance, a source drive line or a drain drive line is led to corresponding driver ICs through corresponding lead via holes.

Step 6: forming pixel electrodes 160 on the first passivation layer 150 by a sixth patterning process, so that the pixel electrodes 160 are respectively connected with the drain electrodes 132 through the via holes formed in the step S5.

Figure 1B:
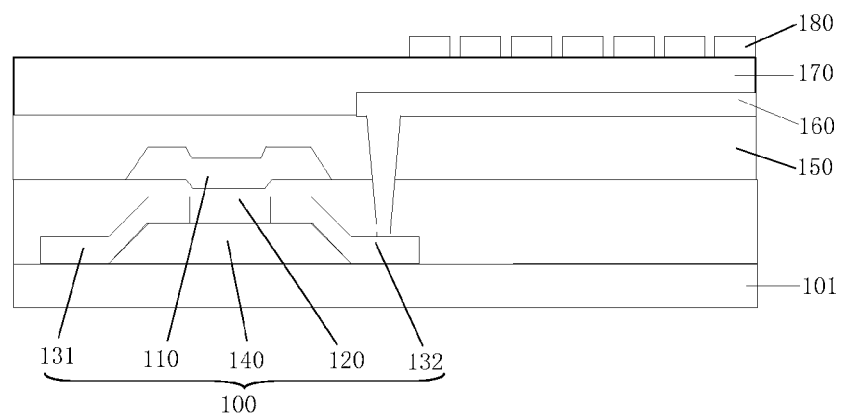
FIG. 1b is a schematic sectional view of an array substrate provided with a top-gate TFT.

FIG. 1*b* illustrates one pixel unit of an advanced-super dimension switch (ADS) mode array substrate. Compared with the example as shown in FIG. 1*a*, a TFT 100 in the array substrate adopts a top-gate structure. Moreover, the array substrate further comprises a second passivation layer 170 and a common electrode 180. The former six patterning processes in the manufacturing method of the array substrate as shown in FIG. 1*b* are similar to the 1 to 6 described above. The difference is that the forming sequence of the gate insulating layer 120 and the gate electrode 110 is correspondingly adjusted according to the structure of the top-gate TFT. On this basis, the manufacturing method of the array substrate further comprises the following steps.

Step 7: forming a second passivation layer 170 by a seventh patterning process.

Step 8: forming common electrodes 180 and common electrode lines (not shown in FIG. 1*b*) connected with the common electrodes 180 by an eighth patterning process.

The inventors of the application have noted in research that: the manufacturing process of the array substrate is relatively complex; at least six patterning processes are generally required (namely 6 masks are required) for manufacturing the array substrate as shown in FIG. 1*a* including one layer of transparent electrodes (e.g., pixel electrodes); at least eight patterning processes are generally required (namely 8 masks are required) for manufacturing an array substrate including two layers of transparent electrodes (e.g., pixel electrodes and common electrodes); and hence the productivity of production lines can be extremely limited.

Embodiments of the present invention provide a TFT and a manufacturing method thereof, an array substrate and a manufacturing method thereof, and a display device. A gate electrode, a source electrode and a drain electrode of the TFT are formed in one patterning process. Compared with the methods as shown in FIGS. 1*a* and 1*b* that the gate electrode and the source/drain electrodes are formed by different patterning processes, the number of masks used in the manufacturing process of the TFT or the array substrate can be reduced; the production process can be reduced; the productivity can be improved; and the production costs can be reduced.

At least one embodiment of the present invention provides a TFT. The TFT comprises an active layer, a gate electrode, a source electrode and a drain electrode respectively electrically connected with the active layer, and a gate insulating layer disposed between the gate electrode and the active layer. The gate electrode, the source electrode and the drain electrode are formed in a same patterning process.

At least one embodiment of the present invention provides an array substrate, which comprises TFTs disposed on a base substrate, and a TFT includes an active layer, a gate electrode, a source electrode and a drain electrode respectively electrically connected with the active layer, and a gate insulating layer disposed between the gate electrode and the active layer. The gate electrode, the source electrode and the drain electrode are formed in a same patterning process.

In the embodiments of the present invention, a patterning process includes processes for forming a pattern via a mask, for instance, includes the steps such as photoresist coating, photoresist exposing, photoresist developing, and etching of a thin-film layer by utilization of a photoresist pattern. But the embodiments are not limited thereto. The patterning process may also be other processes capable of forming the patterns. For instance, the patterns may be formed by a 3D printing process.

In the TFT and the array substrate provided by the embodiments of the present invention, the gate insulating layer may be disposed on the active layer, and the gate electrode, the source electrode and the drain electrode may be disposed on the gate insulating layer, namely a top-gate structure is adopted; or the gate insulating layer may be disposed on the gate electrode, the source electrode and the drain electrode, and the active layer may be disposed on the gate insulating layer, namely a bottom-gate structure is adopted.

The array substrates provided by the embodiments of the present invention are applicable to LCD devices, e.g., LCD devices with display modes such as twisted nematic (TN), vertical alignment (VA), fringe field switching (FFS), in-plane switching (IPS), ADS, HADS or SADS. That is to say, the array substrates provided by the embodiments of the present invention may include one layer of transparent electrodes or two layers of transparent electrodes. Moreover, the two layers of transparent electrodes may be arranged in the same level or different levels. Of course, the array substrates provided by the embodiments of the present invention is also applicable to other types of display devices such as OLED display devices and e-paper display devices.

Detailed description will be given below to the array substrate and the TFT provided by the embodiments of the present invention with reference to the first to fourth embodiments.

First Embodiment

Figure 2A:
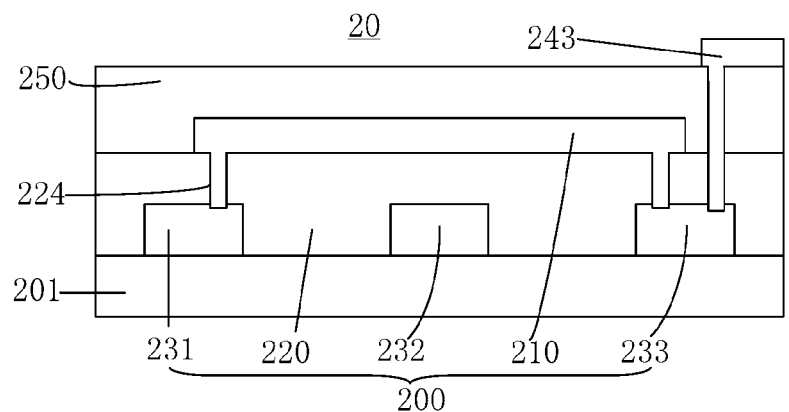
FIGS. 2a and 2b are schematic structural sectional views of an array substrate provided with a bottom-gate TFT, provided by a first embodiment of the present invention.
Figure 2B:
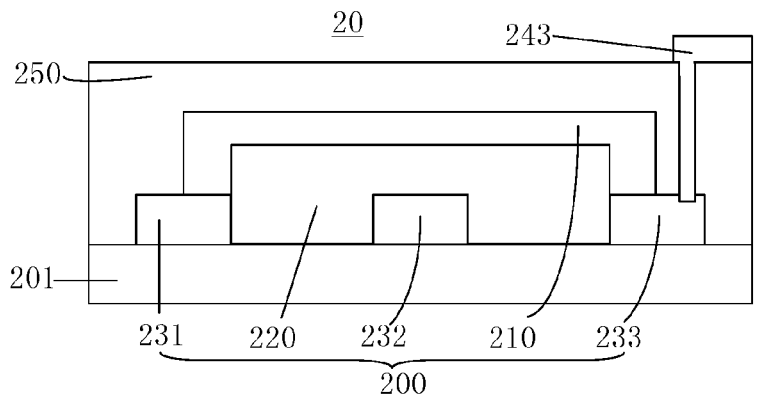

As illustrated in FIGS. 2a and 2b, the embodiment provides a TFT 200 and an array substrate 20. The array substrate 20 comprises a TFT 200 disposed on a base substrate 201, a passivation layer 250 covering the TFT 200, and a transparent electrode 243 disposed on the passivation layer 250. The TFT 200 comprises an active layer 210, a gate electrode 232, a source electrode 231 and a drain electrode 233 respectively electrically connected with the active layer 210, and a gate insulating layer 220 disposed between the gate electrode 232 and the active layer 210. The gate electrode 232, the source electrode 231 and the drain electrode 233 are formed in a same patterning process and arranged in a same layer (the base substrate 201 as shown in FIGS. 2a and 2b) side by side and made from a same material. The transparent electrode 243 is electrically connected with one of the source electrode 231 and the drain electrode 233. Of course, the arrangement of the gate electrode 232, the source electrode 231 and the drain electrode 233 is not limited to the case as shown in FIGS. 2a and 2b, as long as the gate electrode, the source electrode and the drain electrode can be formed in the same patterning process.

The array substrate provided by the embodiment may be applied in an LCD device or an e-paper display device. At this point, the transparent electrode 243 may be a pixel electrode and electrically connected with the drain electrode 233 of the TFT 200, as shown in FIGS. 2a and 2b. Or the array substrate may be applied in an OLED display device. At this point, the transparent electrode 243 may be a cathode or an anode and may be electrically connected with one of the source electrode and the drain electrode of the TFT. The transparent electrode 243 may be made from a transparent metal oxide material such as indium tin oxide (ITO), IGZO and indium zinc oxide (IZO).

The array substrate is also provided with a plurality of gate lines and a plurality of data lines. In the array substrate provided by one embodiment of the present invention, the gate electrodes, the source electrodes and the drain electrodes are formed in the same patterning process. In order to reduce the production processes, the gate lines and the data lines may also be formed in the patterning process. Moreover, as the extension direction of the gate lines is intercrossed with the extension direction of the data lines, for instance, the gate lines are extended in the transverse direction and the data lines are extended in the longitudinal direction, in order to mutually insulate the gate lines and the data line, one of the group of the gate lines and the group of the data lines may be set in a continuous structure, and the other may be set in a segmental structure provided with a plurality of linear portions, and connecting portions may be disposed at intercrossed positions of the gate lines and the data lines to connect adjacent linear portions.

Figure 3A:
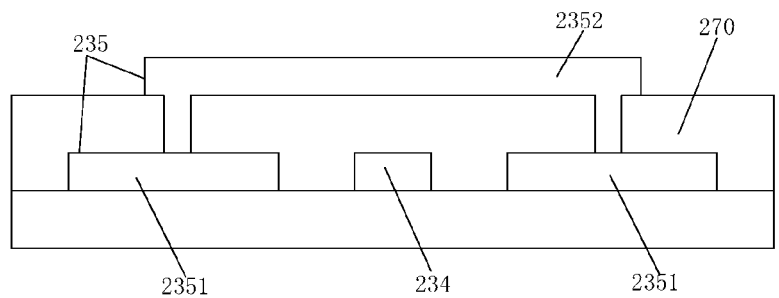
FIG. 3a is a schematic structural sectional view of a first signal line and a second signal line in the first embodiment of the present invention.
Figure 3B:
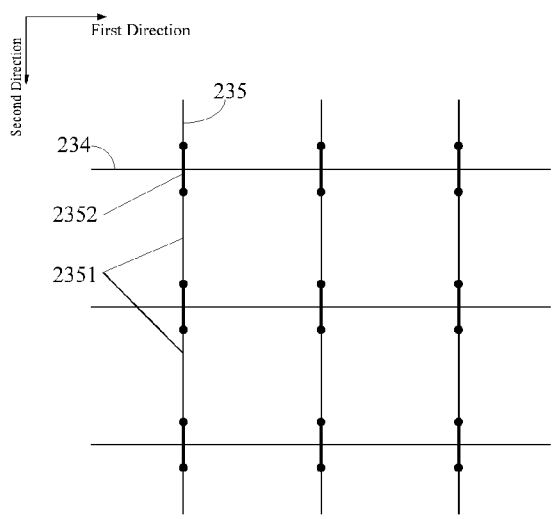
FIG. 3b is a schematic top view of the first signal lines and the second signal lines in the first embodiment of the present invention.

That is to say, in at least one example, as illustrated in FIGS. 3a and 3b, the array substrate further comprises a plurality of first signal lines 235 extended along a first direction and a plurality of second signal lines 234 extended along a second direction. Each first signal line 235 includes a plurality of spaced linear portions 2351 and connecting portions 2352 for connecting adjacent linear portions 2351; the linear portions 2351 and the connecting portions 2352 are arranged in different layers (the connecting portions 2352 may also be disposed below the linear potions 2351 and the second signal lines 234); and the linear portions 2351 and the second signal lines 234 are arranged in the same layer. The first signal lines 235 may be gate lines and the second signal lines 234 may be data lines; or the first signal lines 235 may be data lines and the second signal lines 234 may be gate lines.

In the case as shown in FIG. 3a, an insulating layer 270 is disposed on the linear portions 2351 of the first signal lines 235 and the second signal lines 234; the connecting portions 2352 corresponding to intersections between the first signal lines 235 and the second signal lines 234 are disposed on the insulating layer 270; and the connecting portions 2352 connect adjacent linear portions 2351 through via holes in the insulating layer 270. The insulating layer 270 may include one or a plurality of insulating sub-layers according to the different level on which the connecting portions 2352 are provided. For instance, in order to reduce the production process, the connecting portions 2352 may be formed in the same patterning process as the transparent electrodes 243. In this case, the insulating layer 270 may include the gate insulating layer 220 and the passivation layer 250 as shown in FIGS. 2a and 2b.

Of course, the connecting portions 2352 may also be formed in the same patterning process as other conductive structures on the array substrate. For instance, when the array substrate comprises pixel electrodes and common electrodes arranged in different layers, the transparent electrodes 243 are the pixel electrodes, and the connecting portions 2352 may be formed in the same patterning process as the common electrodes.

It should be noted that FIGS. 3a and 3b only illustrate part of the structures of the array substrate and do not illustrate other structures such as the gate electrode, the source electrode, the drain electrode and the active layer.

For instance, the source electrode 231 and the drain electrode 233 of the TFT may respectively make contact with the active layer 210. For instance, as illustrated in FIG. 2a, via holes 224 respectively corresponding to the source electrode 231 and the drain electrode 233 are formed in the gate insulating layer 220, so that the active layer 210 on the gate insulating layer 220 may be electrically connected with the source electrode 231 and the drain electrode 233 via the formed via holes 224. In addition, the active layer 210 may also be directly lapped and connected to the source electrode 231 and the drain electrode 233, namely the active layer 210 may be electrically connected with the source electrode 231 and the drain electrode 233 without the via holes in the gate insulating layer 220, as shown in FIG. 2b.

In the embodiment, the gate electrode 232, the source electrode 231 and the drain electrode 233 of the TFT may be made from metal such as aluminum, molybdenum, titanium, copper or any alloy thereof, and may be of a single-layer or multi-layer structure.

As the active layer 210 of the TFT 200 respectively makes contact with the source electrode 231 and the drain electrode 233 which are made from a metallic material, the active layer 210 may be made from a semiconductor material such as amorphous silicon, polysilicon, metal oxide or the like.

The gate insulating layer 220 and the passivation layer 250 may be made from one or more selected from insulating materials such as silicon oxide, silicon nitride, silicon oxynitride, aluminum oxide, hafnium oxide, or the like.

In the array substrate 20 provided by the present embodiment, the TFT 200 adopts a bottom-gate structure, namely the gate insulating layer 220 is disposed on the gate electrode 232, the source electrode 231 and the drain electrode 233; and the active layer 210 is disposed on the gate insulating layer 220. As the gate electrode 232, the source electrode 231 and the drain electrode 233 are formed in the same patterning process, compared with the array substrate formed by at least six patterning processes (e.g., the steps 1 to 6) as shown in FIG. 1a, one mask can be saved, so that the productivity can be improved and the production cost can be reduced.

Second Embodiment

Figure 4:
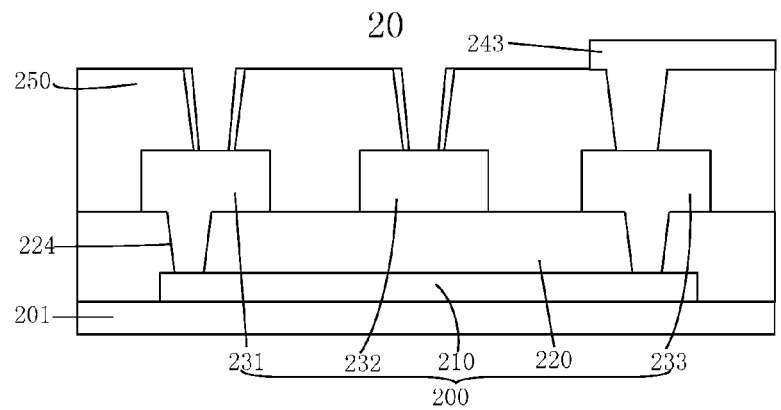
FIG. 4 is a schematic structural sectional view of an array substrate provided with a top-gate TFT, provided by a second embodiment of the present invention.

As illustrated in FIG. 4, the embodiment provides a TFT 200 and an array substrate 20. The difference between the embodiment and the structure as shown in FIG. 2a in the first embodiment is that: the TFT 200 adopts a top-gate structure, namely the gate insulating layer 220 is disposed on the active layer 210, and the gate electrode 232, the source electrode 231 and the drain electrode 233 are disposed on the gate insulating layer 220.

As the TFT 200 adopts the top-gate structure, lead via holes respectively corresponding to drive lines of the gate electrode 232, the source electrode 231 and the drain electrode 233 may be formed in the passivation layer 250. As illustrated in FIG. 4, the internal surface of the lead via holes may be deposited with, for instance, the material for forming the pixel electrodes for the convenience of forming the leads. Of course, the lead via hole corresponding to the drive line of the gate electrode 232 may further be disposed in the gate insulating layer 220.

In the embodiment, the setting of the structures such as the gate lines, the data lines, the transparent electrodes and the active layers may refer to relevant description in the first embodiment. No further description will be given here. In addition, description is given to the TFT 200 and the array substrate 20 as shown in FIG. 4 only by taking the configuration that the top-gate structure is adopted and the source electrode 231 and the drain electrode 233 respectively make contact with the active layer 210 through the via holes 224 as an example. The embodiment of the present invention includes but not limited to the above case. For instance, when the top-gate structure is adopted, the source electrode and the drain electrode may also be respectively lapped and connected to the active layer. For instance, a pattern of the gate insulating layer may be provided in such a way that an orthographic projection of the gate insulating layer on its surface, which is provided with the active layer, is in an area provided with the active layer, and part of the surface of the active layer is exposed, and hence the lapping and connecting of the active layer to the source electrode and the drain electrode can be achieved. The configuration may refer to FIG. 2b and is not shown in the accompanying drawings.

In the embodiment, the gate electrode, the source electrode and the drain electrode are formed in the same patterning process. Compared with the case that the gate electrode and the source/drain electrodes are respectively formed by different patterning processes (the array substrate is formed at least by six patterning processes), one patterning process can be saved, so that one mask can be saved, and hence the productivity can be improved and the production cost can be reduced.

Third Embodiment

Figure 5:
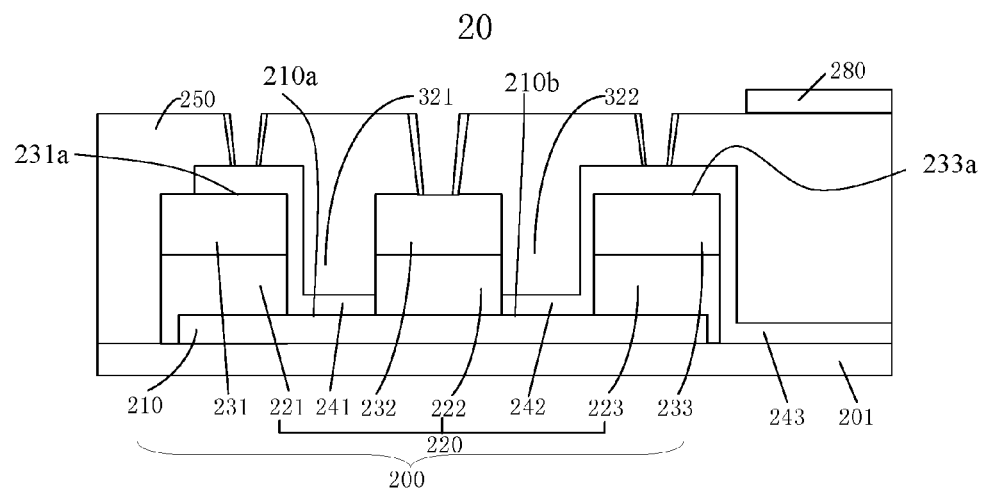
FIG. 5 is a schematic structural sectional view of an array substrate provided with a top-gate TFT, provided by a third embodiment of the present invention.

As illustrated in FIG. 5, the embodiment provides a TFT 200 and an array substrate 20. The differences between the embodiment and the second embodiment are that: in the array substrate 20, the gate insulating layer 220 is formed in the same patterning process as the gate electrode 232, the source electrode 231 and the drain electrode 233; the array substrate 20 is an ADS mode array substrate, namely including two layers of transparent electrodes arranged on different levels; and one of the two layers of transparent electrodes comprises pixel electrodes and the other layer comprises common electrodes.

In the embodiment, the pixel electrodes may be disposed in the lower layer and the common electrodes may be disposed in the upper layer, or the pixel electrodes may be disposed in the upper layer and the common electrodes may be disposed in the lower layer. Description is given in the embodiment only by taking the case that pixel electrodes 243 are disposed between common electrodes 280 and a base substrate 201 (namely the pixel electrodes are disposed in the lower layer and the common electrodes are disposed in the upper layer) as an example.

In the embodiment, as the gate insulating layer 220 is formed in the same patterning process as the gate electrode 232, the source electrode 231 and the drain electrode 233, the width of the gate electrode 232, the source electrode 231 and the drain electrode 233 may be approximately equal to the width of corresponding gate insulating layer in the direction approximately parallel to a plane in which the base substrate 201 is provided.

For instance, as illustrated in FIG. 5, the gate insulating layer 220 may include a first insulating portion 221, a second insulating portion 222 and a third insulating portion 223 which are spaced from each other; the first insulating portion 221 is disposed between the source electrode 231 and the active layer 210; the second insulating portion 222 is disposed between the gate electrode 232 and the active layer 210; and the third insulating portion 223 is disposed between the drain electrode 233 and the active layer 210.

As the gate insulating layer 220 is formed in the same patterning process as the gate electrode 232, the source electrode 231 and the drain electrode 233, the source electrode 231 and the drain electrode 233 cannot be respectively electrically connected with the active layer 210 through the via holes in the gate insulating layer 220 and cannot be directly lapped and connected to the active layer 210 as well. Therefore, in this case, the source electrode 231 and the drain electrode 233 may be respectively electrically connected with the active layer 210 by the means of conductive structures formed after the step of forming the gate electrode 232, the source electrode 231 and the drain electrode 233.

For instance, as illustrated in FIG. 5, the source electrode 231 may be electrically connected with the active layer 210 via a first conductive structure 241; for instance, the first conductive structure 241 may make contact with the upper surface 231a of the source electrode 231 and with part of the upper surface 210a of the active layer 210; the drain electrode 233 may be electrically connected with the active layer 210 through a second conductive structure 242; and for instance, the second conductive structure 242 may make contact with the upper surface 233a of the drain electrode 233 and other part of the upper surface 210b of the active layer 210. Description is given in FIG. 5 only by taking the case that the upper surface of the active layer 210 making contact with the first conductive structure 241 is disposed between the source electrode 231 and the gate electrode 232 and the upper surface of the active layer 210 making contact with the second conductive structure 242 is disposed between the gate electrode 232 and the drain electrode 233 as an example. The embodiment includes but not limited thereto the above case, as long as the source electrode 231 and the drain electrode 233 are respectively electrically connected with the active layer 210.

As illustrated in FIG. 5, a first opening 321 is disposed between the first insulating portion 221 and the second insulating portion 222; a second opening 322 is disposed between the second insulating portion 222 and the third insulating portion 223; the first conductive structure 241 can make contact with the upper surface of the active layer 210 corresponding to the first opening 321; and the second conductive structure 242 can make contact the an upper surface of the active layer 210 corresponding to the second opening 322. But the embodiment of the present invention is not limited thereto the above case.

In order to avoid the electrical connection of the first conductive structure 241 and the second conductive structure 242 respectively with the gate electrode, the layer thickness of the first conductive structure 241 and the second conductive structure 242 in the direction approximately perpendicular to the base substrate 201 is less than the layer thickness of the gate insulating layer 220 (e.g., the second insulating portion 222).

The first conductive structures 241 and the second conductive structures 242 may be formed in the same patterning process as another original conductive structure on the array substrate, so that the process can be reduced. For instance, the first conductive structure 241, the second conductive structure 242 and the pixel electrode 243 may be arranged in the same layer and made from a same material (namely formed by the material of the same layer), and hence may be formed in the same patterning process.

As both the second conductive structure 242 and the pixel electrode 243 are connected with the drain electrode 233 of the TFT 200, the second conductive structure 242 and the pixel electrode 243 may be integrally formed.

As the pixel electrode 243 is generally made from a metal oxide material, when the first conductive structure 241 and the second conductive structure 242 are made from a same material as the pixel electrode 243, the material of the active layer 210 may be a metal oxide semiconductor material. Moreover, before the first conductive structure 241 and the second conductive structure 242 are formed, ion implantation or plasma treatment may be performed at portions of the active layer 210, which portions are to make contact with the first conductive structure 241 and the second conductive structure 242 (for instance, positions corresponding to the first opening 321 and the second opening 322 as shown in FIG. 5) subsequently, so that ohmic contact can be respectively formed between the active layer 210 and the first conductive structure 241 as well as the second conductive structure 242, and hence good electrical connection can be achieved.

In the embodiment, lead via holes respectively corresponding to drive lines for the gate electrode 232, the source electrode 231 and the drain electrode 233 may be formed in the passivation layer 250 between a pixel electrode 243 and a common electrode 280.

In addition, the arrangement of the gate lines and the data lines on the array substrate may also adopt the cases in the first embodiment, namely one of the group of the gate lines and the group of the data lines are continuously arranged and the other are segmented, and various segments are connected with each other through connecting portions. For instance, the first signal line includes a plurality of linear portions spaced from each other and connecting portions for connecting adjacent linear portions; the linear portions of the first signal lines and the second signal lines are arranged in the same layer; and the connecting portions of the first signal lines may be formed in the same patterning process as the common electrodes 280 as shown in FIG. 5 and connected with adjacent linear portions through via holes in the passivation layer 250. The first signal lines may be gate lines and the second signal line may be data lines; or the first signal lines may be data lines and the second signal lines may be gate lines.

Of course, the connecting portions of the first signal lines may also be formed in the same patterning process as other conductive structures on the array substrate according to actual demands. No further description will be given here.

In the embodiment, the gate insulating layer, the gate electrode, the source electrode and the drain electrode are formed in one patterning process. Compared with the array substrate as shown in FIG. 1b in which the above configuration must be formed by three patterning processes, at least two masks can be reduced, so that the productivity can be further improved and the production cost can be reduced.

In addition, as the first insulating portion 221 is disposed between the source electrode 231 and the active layer 210 and the third insulating portion 223 is disposed between the drain electrode 233 and the active layer 210, when signals are respectively inputted into the source/drain electrodes, an electron layer can be formed in the metal oxide semiconductor below the source/drain electrodes, so that the on-state current of the TFT can be effectively increased, and hence the performances of the TFT can be improved.

When the TFT 200 provided by the present embodiment is independently provided without the array substrate 20, the first conductive structure 241 for connecting the source electrode 231 and the active layer 210 and the second conductive structure 242 for connecting the drain electrode 233 and the active layer 210 may be formed by an independent patterning process. In this case, as the gate electrode 232, the source electrode 231 and the drain electrode 233 are formed in the same patterning process, compared with the TFT 100 of the array substrate as shown in FIG. 1b, the TFT can still reduce one patterning process and hence one mask can be saved.

Fourth Embodiment

Figure 6:
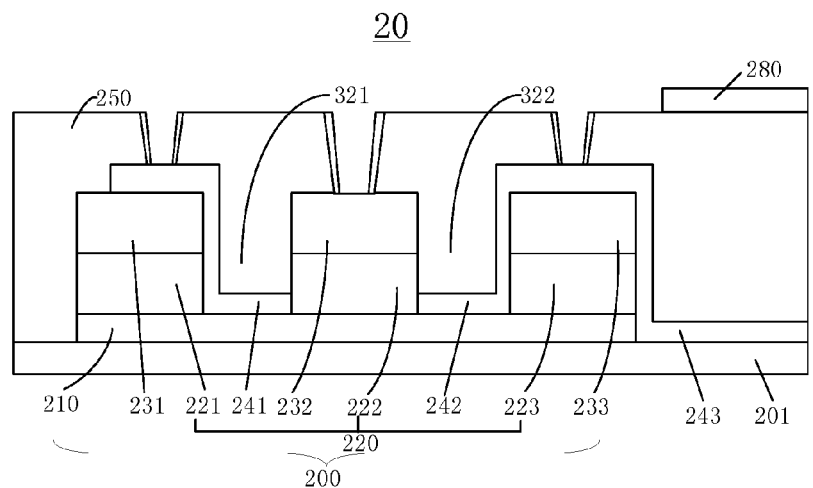
FIG. 6 is a schematic structural sectional view of an array substrate provided with a top-gate TFT, provided by a fourth embodiment of the present invention.

As illustrated in FIG. 6, the embodiment provides a TFT 200 and an array substrate 20. The difference between the embodiment and the third embodiment is that: the active layer 210, the gate insulating layer 220, the gate electrode 232, the source electrode 231 and the drain electrode 233 are formed in the same patterning process (e.g., by a half-tone mask).

In the embodiment, as the gate insulating layer 220 is formed in the same patterning process as the gate electrode 232, the source electrode 231 and the drain electrode 233, the width of the gate electrode 232, the source electrode 231 and the drain electrode 233 may be respectively approximately equal to the width of corresponding gate insulating layer in the direction approximately parallel to the plane in which the base substrate 201 is provided (with reference to the third embodiment, no further description will be given here). On this basis, as the active layer 210 and the gate insulating layer 220 are formed in the patterning process, the width of the gate insulating layer 220 is approximately equal to the width of the active layer 210 in the direction approximately parallel to the base substrate 201.

For instance, the gate insulating layer 220 may include a first insulating portion 221, a second insulating portion 222 and a third insulating portion 223 which are spaced from each other; a first opening 321 is disposed between the first insulating portion 221 and the second insulating portion 222; a second opening 322 is disposed between the second insulating portion 222 and the third insulating portion 223; and the width of the active layer 210 is approximately equal to the sum of the width of the first insulating portion 221, the first opening 321, the second insulating portion 222, the second opening 322 and the third insulating portion 223 in the direction parallel to the base substrate 201.

In the embodiment, the active layer, the gate insulating layer, the gate electrode, the source electrode and the drain electrode are formed in one patterning process. Compared with the array substrate as shown in FIG. 1b, three patterning processes may be at least reduced, namely three masks are at least saved, so that the productivity can be effectively improved and the production cost can be reduced.

In addition, as the first insulating portion 221 is disposed between the source electrode 231 and the active layer 210, and the third insulating portion 223 is disposed between the drain electrode 233 and the active layer 210, when signals are inputted into the source/drain electrodes, an electron layer is formed in the metal oxide semiconductor below the source/drain electrodes, so that the on-state current of the TFT can be effectively increased.

When the TFT 200 provided by the present embodiment is independently provided without the array substrate 20, the first conductive structure 241 for connecting the source electrode 231 and the active layer 210 and the second conductive structure 242 for connecting the drain electrode 233 and the active layer 210 may be formed by an independent patterning process. In this case, as the gate insulating layer 220, the gate electrode 232, the source electrode 231 and the drain electrode 233 are formed in the same patterning process, compared with the TFT 100 of the array substrate as shown in FIG. 1b, the TFT can still reduce two patterning processes and hence can save two masks.

The arrangement of the structures such as the gate line, the data line, the TFT, the pixel electrode, the common electrode, and the lead via holes in the embodiment may refer to relevant description in the third embodiment. No further description will be given here.

Fifth Embodiment

The embodiment provides a display device, which comprises the array substrate provided by any foregoing embodiment.

Figure 7:
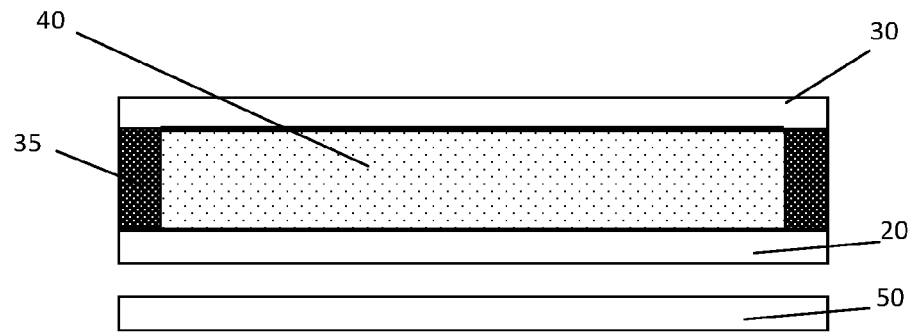
FIG. 7 is a schematic structural sectional view of a display device provided by a fifth embodiment of the present invention.

Taking an LCD device as an example, as illustrated in FIG. 7, the display device provided by one example of the embodiment may comprise an array substrate 20 and an opposing substrate 30. The array substrate 20 and the opposing substrate 30 are arranged opposite to each other to form a liquid crystal cell by sealant 35, and liquid crystal materials 40 are filled in the liquid crystal cell. The opposing substrate 30, for instance, is a color filter (CF) substrate. A pixel electrode in each pixel unit of the array substrate 20 is configured to apply an electric field to control the orientation degree of liquid crystal materials so as to achieve display function. In some embodiments, the display device further comprises a backlight 50 which is configured to provide light for the array substrate 20.

The display device provided by the present embodiment may be: any product or component with display function such as an LCD panel, e-paper, an OLED panel, a mobile phone, a computer, a TV, a display, a notebook computer, a digital picture frame and a navigator.

At least one embodiment of the present invention further provides a method for manufacturing a TFT. The method comprises: forming an active layer, a gate electrode, a source electrode and a drain electrode respectively electrically connected with the active layer, and a gate insulating layer disposed between the gate electrode and the active layer, so that the gate electrode, the source electrode and the drain electrode is formed in the same patterning process.

At least one embodiment of the present invention further provides a method for manufacturing an array substrate. The method comprises: forming TFTs on a base substrate. The TFT is manufactured by the method for manufacturing the TFT provided by the present embodiment.

Detailed description will be given below to the manufacturing method of the array substrate and the manufacturing method of the TFT provided by the present embodiments of the present invention with reference to the embodiments 6 to 8.

Sixth Embodiment

As for the array substrate 20 provided by the second embodiment, the embodiment provides a method for manufacturing a corresponding array substrate. Taking the case as shown in FIG. 4 as an example, the method may comprise the following steps S41 to S45. Description will be given to the steps one by one.

Step S41: forming active layers 210 on a base substrate 201 by a first patterning process (also referred to as mask process, e.g., including steps such as exposing, developing and etching).

Step S42: forming a gate insulating layer 220 on the active layers 210 by a second patterning process, and forming via holes 224, through which the active layers 210 are exposed, at positions of the gate insulating layer 220 respectively corresponding to source electrodes 231 and drain electrodes 233 to be formed.

Step S43: forming the source electrodes 231, gate electrodes 232, the drain electrodes 233, linear portions of first signal lines, and second signal lines on the gate insulating layer 220 by a third patterning process, so that the source electrodes 231 and the drain electrodes 233 are respectively electrically connected with the active layers 210 through the via holes formed in the step S42.

In this step, one of the group of the first signal lines and the group of the second signal lines are gate lines and the other are data lines. Moreover, the first signal lines and the second signal lines are not shown in FIG. 4.

Step S44: forming a passivation layer 250 by a fourth patterning process, and forming first via holes through which the drain electrodes 233 are exposed, second via holes (not shown in FIG. 4) through which the linear portions of the first signal lines are exposed, and lead via holes in the passivation layer 250.

As described above, a lead via hole is configured to achieve the connection between an electrode drive line and a corresponding driver IC. For instance, the lead via holes may include lead via holes respectively corresponding to drive lines of the gate electrodes 232, drive lines of the source electrodes 231 and drive lines of the drain electrodes 233.

It should be noted that the lead via holes in FIG. 4 are only intended to illustrate the embodiment. In specific practice, generally, the lead via holes are formed in pad areas of the array substrate, and TFTs at pixel areas do not correspond to the lead via holes.

Step S45: forming transparent electrodes 243 and connecting portions of the first signal lines on the passivation layer 250 by a fifth patterning process, so that the transparent electrodes 243 are electrically connected with the drain electrodes 233 via the first via holes formed in the step S44 and the connecting portions of the first signal lines are connected with adjacent linear portions via the second via holes formed in the step S44.

In the step, the material of the transparent electrodes 243 may also cover the internal surfaces of the lead via holes, as shown in FIG. 4, so that leads can be conveniently formed.

As for the TFT 200 provided by the second embodiment, the embodiment provides a method for manufacturing a TFT. Taking the case as shown in FIG. 4 as an example, the method may comprise the steps S41 and S42 in the embodiment and the step of forming a source electrode 231, a gate electrode 232 and a drain electrode 233 on a gate insulating layer 220 by the third patterning process, so that the source electrode 231 and the drain electrode 233 are respectively electrically connected with an active layer 210 through via holes formed in the step S42, namely the steps of: forming the active layer 210 by a first patterning process; forming the gate insulating layer 220 on the active layer 210 by a second patterning process, and forming via holes 224, through which the active layer 210 is exposed, at positions of the gate insulating layer 220 respectively corresponding to the source electrode 231 and the drain electrode 233; and forming the source electrode 231, the gate electrode 232 and the drain electrode 233 on the gate insulating layer 220 by a third patterning process, so that the source electrode 231 and the drain electrode 233 are respectively electrically connected with the active layer through the via holes.

In the array substrate or the TFT provided by the present embodiment, if the source electrode and the drain electrode are lapped and connected to the active layer, in the step of forming the gate insulating layer, a pattern of the gate insulating layer may be formed to expose the surfaces of the source electrode and the drain electrode, so that the source electrode and the drain electrode can be lapped and connected to the active layer. No further description will be given here.

Compared with the case as shown in FIG. 1a, both the manufacturing method of the array substrate and the manufacturing method of the TFT provided by the present embodiment can reduce one patterning process.

The manufacturing method of the array substrate 20/the TFT 200 as shown in FIG. 2a provided by the first embodiment is similar to the manufacturing method provided by the present embodiment. The difference is that the step of forming the active layer is after the step of forming the source electrode, the gate electrode and the drain electrode and the step of forming the gate insulating layer. That is to say, the manufacturing method of the array substrate 20/the TFT 200 as shown in FIG. 2a provided by the first embodiment comprises: forming a source electrode 231, a gate electrode 232 and a drain electrode by a first patterning process; forming a gate insulating layer 220 by second patterning process, and forming via holes 224, through which the source electrode 231 and the drain electrode 233 are exposed, at positions of the gate insulating layer 220 respectively corresponding to the source electrode 231 and the drain electrode 233; and forming an active layer 210 on the gate insulating layer 220 by a third patterning process, so that the active layer 220 is respectively electrically connected with the source electrode 231 and the drain electrode 233 through the via holes 224. Corresponding steps may refer to relevant description in the embodiment. No further description will be given here.

The difference between the manufacturing method of the array substrate 20/the TFT 200 as shown in FIG. 2b provided by the first embodiment and the manufacturing method of the array substrate/the TFT 200 as shown in FIG. 2a is that: the via holes 224 are not formed in the gate insulating layer 220 in the step of forming the gate insulating layer 220, and a pattern of the gate insulating layer 220 is formed to expose the surfaces of the source electrode 231 and the drain electrode 233, so that the source electrode 231 and the drain electrode 233 can be electrically connected with the active layer 210.

Seventh Embodiment

As for the array substrate provided by the third embodiment, the embodiment provides a manufacturing method of an array substrate. The manufacturing method comprises: forming a gate insulating layer, gate electrodes, source electrodes and drain electrodes of TFTs by one patterning process; and forming pixel electrodes electrically connected with the drain electrodes and common electrodes arranged in different layers from the pixel electrodes. When the pixel electrodes or the common electrodes are formed, first conductive structures for electrically connecting the source electrodes and the active layers and second conductive structures for electrically connecting the drain electrodes and the active layers are also formed. For instance, first conductive structures making contact with upper surfaces of the source electrodes and upper surfaces of the active layers and second conductive structures making contact with upper surfaces of the drain electrodes and upper surfaces of the active layers are formed. Before the step of forming the first conductive structures and the second conductive structures, ion implantation or plasma treatment is performed on the upper surfaces of the active layers which are going to make contact with the first conductive structures and the second conductive structures.

As illustrated in FIG. 5, the array substrate 20 comprises pixel electrodes 243 and common electrodes 280. Taking the case that the first conductive structures 241 and the second conductive structures 242 as shown in FIG. 5 are arranged in the same layer as the pixel electrodes 243 as an example, the manufacturing method of the array substrate provided by the present embodiment may comprise the following steps S51 to S55. Description will be given below to the steps one by one.

Step S51: forming active layers 210 on a base substrate 201 by a first patterning process.

Step S52: forming a gate insulating layer 220, and gate electrodes 232, source electrodes 231, drain electrodes 233, linear portions of first signal lines and second signal lines disposed on the gate insulating layer 220, on the active layers 210, by a second patterning process; and performing ion implantation or plasma treatment on portions of the surface of the active layers 210, which portions are going to make contact with first conductive structures 241 and second conductive structures 242 (e.g., partial upper surfaces 210a and 210b of the active layers 210 as shown in FIG. 5), so that the electric conductivity of the surfaces can be improved.

In this step, the gate insulating layer 220 includes a first insulating portion 221 corresponding to the source electrode 231, a second insulating portion 222 corresponding to the gate electrode 232, and a third insulating portion 223 corresponding to the drain electrode 233. Moreover, the widths of the electrodes are respectively equal to the widths of corresponding insulating portions in the direction approximately parallel to the base substrate.

In addition, one of the group of the first signal lines and the group of the second signal lines are gate lines and the other are data lines. The linear portions of the first signal lines and the second signal lines are not shown in FIG. 5.

Step S53: forming pixel electrodes 243, first conductive structures 241 for connecting the source electrodes 231 and the active layers 210, and second conductive structures 242 for connecting the drain electrodes 233 and the active layers 210, by a third patterning process.

In this step, part of the material for forming pixel electrodes must be etched away to render various leads (e.g., the linear portions of the first signal lines and the second signal lines) to be insulated from each other. For instance, the material for forming pixel electrodes at intersections between the first signal lines and the second signal lines are etched away to achieve the insulation between the linear portions of the first signal lines and also between the linear portions and the second signal lines. Because the etching rate of the etching liquid/agent for etching the pixel electrode material compared to a metallic material is very low, the influence of the etching process on the linear portions of the first signal lines and the second signal lines may be ignored.

In addition, the pixel electrode 243 and the second conductive structure 242 may be integrally formed and respectively disposed on both sides of the drain electrode 233.

Step S54: forming a passivation layer 250, and by a fourth patterning process forming via holes through which the first signal lines are exposed, and lead via holes in the passivation layer 250 (as shown in the sixth embodiment, no further description will be given here).

Step S55: forming common electrodes 280, common electrode lines connected with the common electrodes, and connecting portions of the first signal lines on the passivation layer 250 by a fifth patterning process, so that the connecting portions of the first signal lines are connected with adjacent linear portions through the via holes formed in the step S54.

In this step, the material for forming the common electrodes 280 may also cover internal surfaces of the lead via holes formed in the step S54, so that leads can be conveniently formed.

The embodiment further provides a method for manufacturing the TFT 200 as shown in FIG. 5. The method comprises: forming an active layer 210 by a first patterning process; forming a gate insulating layer 220, and a gate electrode 232, a source electrode 231 and a drain electrode 233 disposed on the gate insulating layer 220, on the active layer 210, by a second patterning process; performing ion implantation or plasma treatment on at least portions of the surface of the active layer 210, which portions are not covered by the gate insulating layer 220 (namely surfaces which are going to make contact with a first conductive structure 241 and a second conductive structure 242), so that the electrical conductivity here can be improved; and forming the first conductive structure 241 for electrically connecting the source electrode 231 and the active layer 210 and the second conductive structure 242 for electrically connecting the drain electrode 233 and the active layer 210 by a third patterning process.

In the manufacturing method of the TFT provided by the present embodiment, the first conductive structure and the second conductive structure may be formed by the means of independently forming a conductive layer (e.g., a metal layer).

Eighth Embodiment

As for the array substrate provided by the fourth embodiment, the embodiment provides a manufacturing method of an array substrate. The manufacturing method comprises: forming active layers, a gate insulating layer, gate electrodes, source electrodes and drain electrodes of TFTs by one patterning process; and forming pixel electrodes electrically connected with the drain electrodes and common electrodes arranged in different layers from the pixel electrodes. When the pixel electrodes or the common electrodes are formed, first conductive structures for electrically connecting the source electrodes and the active layers and also second conductive structures for electrically connecting the drain electrodes and the active layers are also formed. For instance, first conductive structures making contact with upper surfaces of the source electrodes and upper surfaces of the active layers and second conductive structures making contact with upper surfaces of the drain electrodes and upper surfaces of the active layers are formed. Before the step of forming the first conductive structures and the second conductive structures, ion implantation or plasma treatment is performed at portions of the active layers, which portions are going to make contact with the first conductive structures and the second conductive structures.

As illustrated in FIG. 6, the array substrate 20 comprises pixel electrodes 243 and common electrodes 280. Taking the case that the first conductive structures 241 and the second conductive structures 242 as shown in FIG. 6 are arranged in the same layer as the pixel electrodes 243 as an example, the manufacturing method of the array substrate provided by the present embodiment may comprise the following steps S61 to S64. Description will be given below to the steps one by one.

Step S61: forming active layers 210, a gate insulating layer 220, gate electrodes 232, source electrodes 231, drain electrodes 233, linear portions of first signal lines and second signal lines on a base substrate 201 by first patterning process; and performing ion implantation or plasma treatment on surfaces of the active layers 210 which are going to make contact with first conductive structures 241 and second conductive structures 242, so that the electrical conductivity of the surfaces can be improved.

For instance, the first patterning process may adopt a half-tone mask to conduct. Description will be given below as shown in the following steps S611 to S614 and with reference to FIGS. 8a to 8c.

Step S611: sequentially depositing a metal oxide semiconductor film, a gate insulating layer film and a metal film on a base substrate 201, and coating one layer of photoresist on the metal film.

Figure 8A:
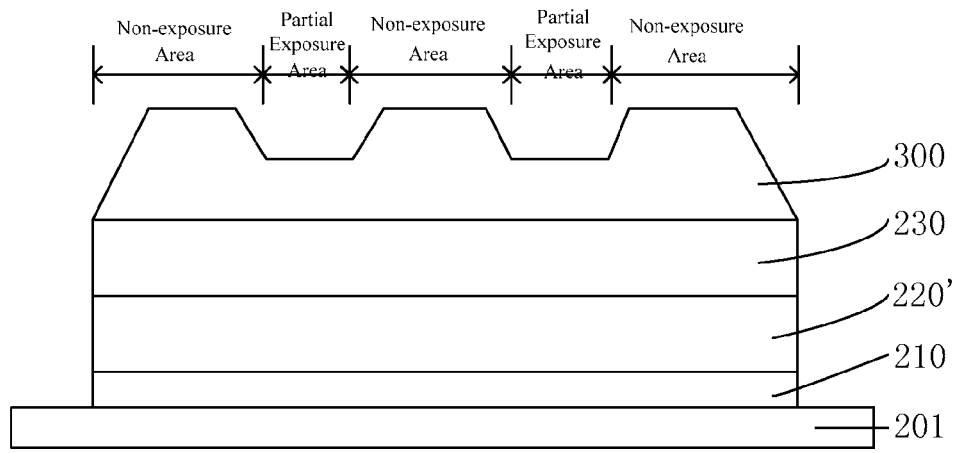
FIGS. 8a to 8c are schematic structural sectional views of a substrate obtained after various steps in the first patterning process via a half-tone mask in an eighth embodiment of the present invention.

Step S612: adopting a half-tone mask for exposing and then developing, etching the metal film, the gate insulating layer film and the metal oxide semiconductor film which are not protected by the photoresist, and obtaining the substrate as shown in FIG. 8a.

The half-tone mask includes non-exposure areas, partial exposure areas and full exposure areas. As illustrated in FIG. 8a, the full exposure areas (not shown in FIG. 8a) are disposed on both sides of the non-exposure area. The non-exposure areas correspond to the gate electrodes, the source electrodes, the drain electrodes, the linear portions of the first signal lines, the second signal lines and other structures to be formed; the partial exposure areas correspond to first openings and second openings to be formed; and the rest areas are the full exposure areas.

After development, the photoresist in the full exposure areas is removed; parts of the metal film, parts of the gate insulating layer film and parts of the metal oxide semiconductor film corresponding to the full exposure areas are etched because they are not protected by the photoresist; and the other parts are retained.

As illustrated in FIG. 8a, after the step S612, active layers 210, etched gate insulating layer film 220', etched metal film 230, and photoresist 300 for covering the metal film 230 may be obtained.

Figure 8B:
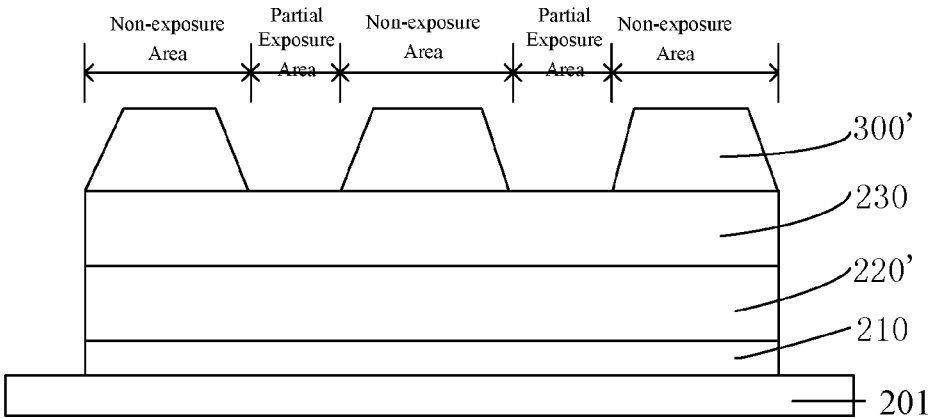

Step S613: performing an ashing treatment on the photoresist 300, and obtaining the substrate as shown in FIG. 8b. At this point, ashed photoresist 300' covers one part of the metal film 230.

Figure 8C:
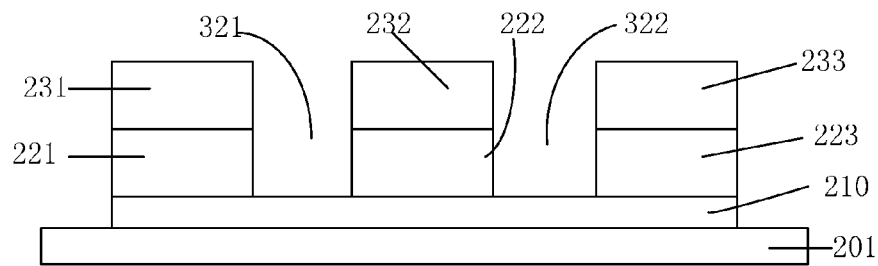

Step S614: etching the metal film 230 and the gate insulating layer film 220' which are not protected by the photoresist 300' while retaining a part of the active layers 210 not protected by the photoresist 300', and obtaining the substrate as shown in FIG. 8c. Thus, a planar structure in which the gate electrodes 232, source electrodes 231 and drain electrodes 233, linear portions of first signal lines and second signal lines are included can be formed. The gate insulating layer film 220' is adopted to form a gate insulating layer, which includes first insulating portions 221, second insulating portions 222 and third insulating portions 223. Moreover, first openings 321 and second openings 322 through which the active layers 210 are exposed are formed in the gate insulating layer.

Figure 8D:
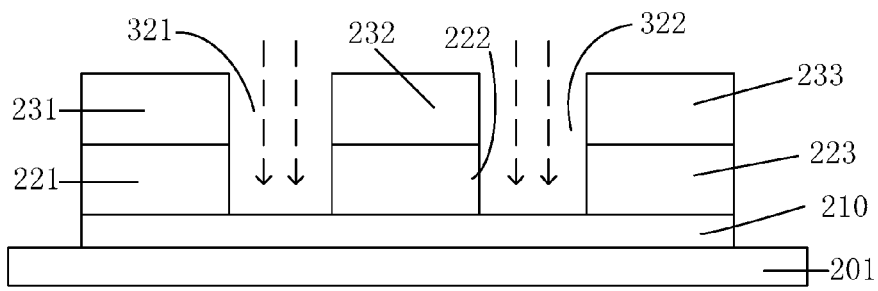
FIG. 8d is a schematic structural view of a substrate obtained after the ion implantation or plasma treatment of the substrate obtained after the first patterning process in an eighth embodiment of the present invention.

After the first patterning process is completed, the step S615 is executed: as illustrated in FIG. 8d, ion implantation or plasma treatment is performed on portions of the surfaces of the active layers, which portions correspond to the first openings 321 and the second openings 322, so as to reduce the contact resistance at the positions.

After the above steps, the widths of the source electrode 231, the gate electrode 232 and the drain electrode 233 is respectively approximately equal to the widths of the corresponding portions of the insulating layer in the direction approximately parallel to the base substrate; and the width of the gate insulating layer is approximately equal to the width of the active layer 210 in the direction approximately parallel to the base substrate 201, namely the sum of the width of the first insulating portion 221, the first opening 321, the second insulating portion 222, the second opening 322 and the third insulating portion 223 is approximately equal to the width of the active layer.

In addition, one of the group of the first signal lines and the group of the second signal lines are gate lines, and the other are data lines. The linear portions of the first signal lines and the second signal lines are not shown in FIGS. 8a to 8d.

Figure 8E:
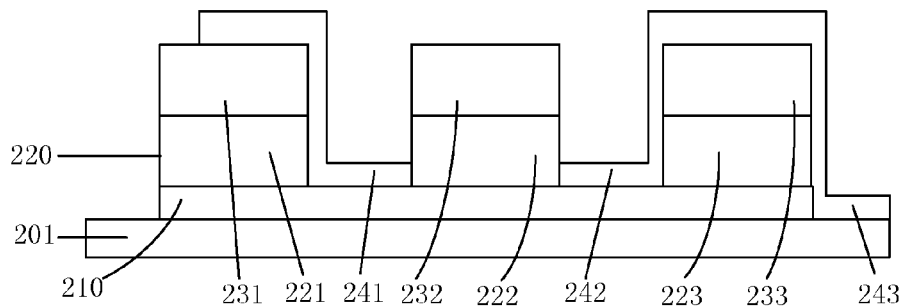
FIG. 8e is a schematic structural sectional view of a substrate obtained after secondary patterning process in an eighth embodiment of the present invention.

Step S62: forming pixel electrodes 243 by a second patterning process, forming first conductive structures 241 to allow the source electrodes 231 to be connected with the active layers 210 and forming second conductive structures 242 to allow the drain electrodes 233 to be connected with the active layers 210 so as to enable conductive channels, and for instance, obtaining the substrate as shown in FIG. 8e.

In this step, parts of the material for forming pixel electrodes must be etched away to have various leads (e.g., the linear portions of the first signal lines and the second signal lines) to be insulated from each other. For instance, the pixel electrode material at intersections between the first signal lines and the second signal lines are etched away to achieve the insulation between the linear portions of the first signal lines as well as between the linear portions and the second signal lines. As the etching rate of etching liquid/agent for etching the pixel electrode material compared with a metallic material is very low, the influence of the etching effect on the linear portions of the first signal lines and the second signal lines can be ignored.

In addition, the pixel electrode 243 and the second conductive structure 242 may be integrally formed and are respectively disposed on both sides of the drain electrode 233.

Figure 8F:
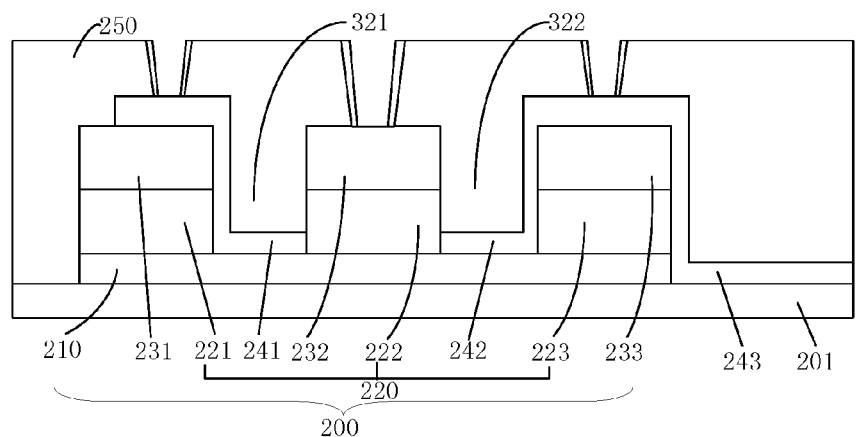
FIG. 8*f* is a schematic structural sectional view of a substrate obtained after third patterning process in an eighth embodiment of the present invention.

Step S63: forming a passivation layer 250 by a third patterning process, forming via holes, through which the linear portions of the first signal lines are exposed, and lead via holes in the passivation layer 250, and for instance, obtaining the substrate as shown in FIG. 8f.

S64: forming common electrodes 280, common electrode lines connected with the common electrodes, and connecting portions of the first signal lines on the passivation layer 250 by a fourth patterning process, so that the connecting portions of the first signal lines are connected with adjacent linear portions through the via holes formed in the step S63, and obtaining the substrate as shown in FIG. 6.

In this step, the material of forming the common electrodes 280 may also cover internal surfaces of the lead via holes formed in the step S63, so that leads can be conveniently formed.

In the embodiment, the active layers, the gate insulating layer, the gate electrodes and the source/drain electrodes of the TFTs are formed by one patterning process, and the source/drain electrodes and the active layers are connected by the material for forming the pixel electrodes to enable conducting channels. Compared with the case as shown in FIG. 1b, three patterning processes may be reduced, so that the number of masks can be effectively reduced, and hence the productivity can be improved and the cost can be saved. Moreover, when signals are inputted into the source/drain electrodes, an electron layer may also be formed in the metal oxide semiconductor material below the source/drain electrodes, so that the on-state current of the TFTs can be effectively increased, and hence the performances of the TFTs can be improved.

The embodiment further provides a manufacturing method of the TFT 200 as shown in FIG. 6. The method may comprise: forming an active layer 210, a gate insulating layer 220, a gate electrode 232, a source electrode 231 and a drain electrode 233 by a first patterning process (e.g., via a half-tone mask, with reference to the step S61); performing ion implantation or plasma treatment on portions of the surface of the active layer 210 not covered by the gate insulating layer 220 (namely the portions of the surface which are going to respectively make contact with a first conductive structure 241 and a second conductive structure 242), so that the electrical conductivity here can be improved; and forming the first conductive structure 241 for electrically connecting the source electrode 231 and the active layer 210 and the second conductive structure 242 for electrically connecting the drain electrode 233 and the active layer 210 by a second patterning process.

In the manufacturing method of the TFT provided by the present embodiment, the first conductive structure and the second conductive structure may be obtained by the means of independently forming a conductive layer (e.g., a metal layer).

It should be noted that: as for a large-sized display device, in the array substrate including two layers of transparent electrodes (as shown in FIGS. 5 and 6), metal common electrode lines may also be formed by utilization of the material for forming gate lines, and common electrodes are electrically connected with the metal common electrode lines through via holes in the insulating layer below the common electrodes, so that the resistance of the common electrodes can be reduced. No further description will be given here.

In the embodiment of the present invention, structures formed by the same layer of film may be disposed in the same layer side by side (namely different structures arranged in the same layer), for example, the gate electrode 232, the source electrode 231 and the drain electrode 233 that are disposed in the same layer side by side as shown in FIGS. 2a, 2b, 4, 5 and 6. The structures formed by the same layer of film may also have up-and-down (undulate) shapes, for example, the first conductive structure 241, the second conductive structure 242 and the pixel electrode 243 as shown in FIGS. 5 and 6.

What are described above is related to the illustrative embodiments of the disclosure only and not limitative to the scope of the disclosure; the scopes of the disclosure are defined by the accompanying claims.

The application claims priority to the Chinese patent application No. 201510308890.7, filed on Jun. 8, 2015, the entire disclosure of which is incorporated herein by reference as part of the present application.

What is claimed is:

1. An array substrate, comprising a thin-film transistor (TFT) disposed on a base substrate, wherein the TFT includes:
    an active layer;
    a gate electrode, a source electrode, and a drain electrode respectively electrically connected with the active layer; and
    a gate insulating layer disposed between the gate electrode and the active layer, wherein the gate electrode, the source electrode, and the drain electrode are formed by a same film layer, and wherein materials of the gate electrode, the source electrode, and the drain electrode are the same,
    wherein the gate insulating layer, the gate electrode, the source electrode, and the drain electrode are formed in a same pattering process, and the same patterning process is performed using a single mask.

2. The array substrate according to claim 1, further comprising a plurality of first signal lines extended along a first direction and a plurality of second signal lines extended along a second direction and insulated from the first signal lines,
    wherein each first signal line includes a plurality of spaced linear portions and connecting portions for connecting adjacent linear portions; the connecting portions and the linear portions are arranged in different layers; the linear portions and the second signal lines are arranged in a same layer; and
    the first signal lines are gate lines and the second signal lines are data lines; or the first signal lines are data lines and the second signal lines are gate lines.

3. The array substrate according to claim 1, wherein the gate insulating layer is disposed on the active layer; and the gate electrode, the source electrode, and the drain electrode are disposed on the gate insulating layer.

4. The array substrate according to claim 3, wherein the gate insulating layer includes a first insulating portion, a second insulating portion, and a third insulating portion, which are spaced from each other;
    the first insulating portion is disposed between the source electrode and the active layer;
    the second insulating portion is disposed between the gate electrode and the active layer; and
    the third insulating portion is disposed between the drain electrode and the active layer.

5. The array substrate according to claim 4, wherein a first opening is disposed between the first insulating portion and the second insulating portion; a second opening is disposed between the second insulating portion and the third insulating portion; and
    a width of the active layer is equal to a sum of widths of the first insulating portion, the first opening, the second insulating portion, the second opening, and the third insulating portion, in a direction parallel to the base substrate.

6. The array substrate according to claim 4, wherein
    the source electrode is electrically connected with the active layer through a first conductive structure, wherein the first conductive structure makes contact with an upper surface of the source electrode and a part of an upper surface of the active layer; and
    the drain electrode is electrically connected with the active layer through a second conductive structure, wherein the second conductive structure makes contact with an upper surface of the drain electrode and another part of the upper surface of the active layer.

7. The array substrate according to claim 6, further comprising: a pixel electrode electrically connected with the drain electrode and a common electrode arranged in different layers from the pixel electrode, wherein
    the first conductive structure, the second conductive structure, and the pixel electrode are formed in a same one process and made from a same material, or the first conductive structure, the second conductive structure, and the common electrode are formed in a same one process and made from a same material.

8. The array substrate according to claim 1, wherein the gate insulating layer is disposed on the gate electrode, the source electrode, and the drain electrode; and the active layer is disposed on the gate insulating layer.

9. The array substrate according to claim 1, wherein the source electrode and the drain electrode make contact with the active layer.

10. The array substrate according to claim 9, wherein the gate insulating layer is provided with via holes respectively corresponding to the source electrode and the drain electrode; and the source electrode and the drain electrode respectively make contact with the active layer through the via holes; or
  the source electrode and the drain electrode are lapped and connected to the active layer.

11. A display device, comprising the array substrate according to claim 1.

12. A method for manufacturing a thin film transistor (TFT), comprising:
  forming an active layer, and a gate electrode, a source electrode, and a drain electrode respectively electrically connected with the active layer, and forming a gate insulating layer disposed between the gate electrode and the active layer, wherein
  the gate electrode, the source electrode, and the drain electrode are formed by a same film layer, and wherein materials of the gate electrode, the source electrode, and the drain electrode are the same,
  wherein the gate insulating layer, the gate electrode, the source electrode, and the drain electrode are formed in a same patterning process, and the same patterning process is performed using a single mask.

13. The method according to claim 12, wherein the active layer, the gate insulating layer, the gate electrode, the source electrode, and the drain electrode are formed in the same patterning process by a half-tone mask.

14. The method according to claim 13, wherein
  the active layer, the gate insulating layer, the gate electrode, the source electrode, and the drain electrode are formed by a first patterning process;
  a surface of the active layer not covered by the gate insulating layer is subjected to ion implantation or plasma treatment; and
  a first conductive structure for electrically connecting the source electrode and the active layer, and a second conductive structure for electrically connecting the drain electrode and the active layer, are formed by a second patterning process.

15. The method according to claim 12, wherein
  the active layer is formed by a first patterning process;
  the gate insulating layer, and the gate electrode, the source electrode, and the drain electrode, disposed on the gate insulating layer, are formed on the active layer by a second patterning process;
  at least part of a surface of the active layer not covered by the gate insulating layer is subjected to ion implantation or plasma treatment; and
  a first conductive structure for electrically connecting the source electrode and the active layer, and a second conductive structure for connecting the drain electrode and the active layer, are formed by a third patterning process.

16. A method for manufacturing an array substrate, comprising: forming a thin film transistor (TFT) on a base substrate, wherein the TFT is manufactured by the method according to claim 12.

17. The method according to claim 16, further comprising:
  forming a pixel electrode electrically connected with the drain electrode, and forming a common electrode arranged in a different layer from the pixel electrode, wherein
  the active layer, the gate insulating layer, the gate electrode, the source electrode, and the drain electrode are formed by a first patterning process;
  a surface of the active layer not covered by the gate insulating layer is subjected to ion implantation or plasma treatment; and
  the pixel electrode or the common electrode, a first conductive structure for electrically connecting the source electrode and the active layer, and a second conductive structure for connecting the drain electrode and the active layer, are formed by a second patterning process.

18. A method for manufacturing a thin film transistor (TFT), comprising:
  forming an active layer, and a gate electrode, a source electrode, and a drain electrode respectively electrically connected with the active layer, and forming a gate insulating layer disposed between the gate electrode and the active layer, wherein
  the gate electrode, the source electrode, and the drain electrode are formed in a same patterning process and wherein materials of the gate electrode, the source electrode, and the drain electrode are the same,
  wherein the active layer is formed by a first patterning process; the gate insulating layer is formed on the active layer by a second patterning process, and via holes through which the active layer is exposed are formed at positions of the gate insulating layer respectively corresponding to the source electrode and the drain electrode; and the source electrode, the gate electrode, and the drain electrode are formed on the gate insulating layer by a third patterning process, so that the source electrode and the drain electrode are respectively electrically connected with the active layer through the via holes; or
  the source electrode, the gate electrode, and the drain electrode are formed by a first patterning process; the gate insulating layer is formed by a second patterning process, and via holes through which the source electrode and the drain electrode are respectively exposed are formed at positions of the gate insulating layer respectively corresponding to the source electrode and the drain electrode; and the active layer is formed on the gate insulating layer by a third patterning process, so that the active layer is respectively electrically connected with the source electrode and the drain electrode through the via holes.

* * * * *